(12) United States Patent
Hsiao et al.

(10) Patent No.: US 10,841,679 B2
(45) Date of Patent: Nov. 17, 2020

(54) MICROELECTROMECHANICAL SYSTEMS PACKAGE STRUCTURE

(71) Applicant: Advanced Semiconductor Engineering, Inc., Kaohsiung (TW)

(72) Inventors: Hsu-Liang Hsiao, Kaohsiung (TW); Yu-Hsuan Tsai, Kaohsiung (TW); Pu Shan Huang, Kaohsiung (TW); Ching-Han Huang, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/879,335

(22) Filed: Jan. 24, 2018

(65) Prior Publication Data

US 2018/0213312 A1 Jul. 26, 2018

(30) Foreign Application Priority Data

Jan. 26, 2017 (TW) .............................. 106201644 U

(51) Int. Cl.
*H04R 1/04* (2006.01)
*B81B 7/00* (2006.01)
(Continued)

(52) U.S. Cl.
CPC ............... *H04R 1/04* (2013.01); *B81B 7/007* (2013.01); *B81B 7/0061* (2013.01);
(Continued)

(58) Field of Classification Search
CPC .......... H04R 1/04; H04R 1/021; H04R 31/00; H04R 2201/003; H04R 2410/03;
(Continued)

(56) References Cited

U.S. PATENT DOCUMENTS 8,030,722 B1 * 10/2011 Bolognia .............. B81B 7/0061
257/433
9,078,063 B2 * 7/2015 Loeppert .................. H04R 1/04
(Continued)

FOREIGN PATENT DOCUMENTS

CN 1942393 A 4/2007
CN 102572666 A 7/2012
(Continued)

OTHER PUBLICATIONS

Office Action from corresponding Chinese Patent Application No. 201810057842.9, dated Nov. 21, 2019, 11 pages.
(Continued)

*Primary Examiner* — Stephen W Smoot
*Assistant Examiner* — Vicki B. Booker
(74) *Attorney, Agent, or Firm* — Foley & Lardner LLP

(57) ABSTRACT

A microelectromechanical systems package structure includes a first substrate, a transducer unit, a semiconductor chip and a second substrate. The first substrate defines a through hole. The transducer unit is electrically connected to the first substrate, and includes a base and a membrane. The membrane is located between the through hole and the base. The semiconductor chip is electrically connected to the first substrate and the transducer unit. The second substrate is attached to the first substrate and defines a cavity. The transducer unit and the chip are disposed in the cavity, and the second substrate is electrically connected to the transducer unit and the semiconductor chip through the first substrate.

36 Claims, 5 Drawing Sheets

(51) Int. Cl.
*B81C 1/00* (2006.01)
*H04R 1/02* (2006.01)
*H04R 31/00* (2006.01)

(52) U.S. Cl.
CPC ........ *B81B 7/0064* (2013.01); *B81C 1/00309* (2013.01); *H04R 1/021* (2013.01); *B81B 2201/0257* (2013.01); *B81B 2207/012* (2013.01); *B81B 2207/096* (2013.01); *H04R 31/00* (2013.01); *H04R 2201/003* (2013.01); *H04R 2410/03* (2013.01)

(58) Field of Classification Search
CPC .. H04R 1/2807; H04R 19/04; B81C 1/00309; B81B 7/0064; B81B 7/007; B81B 7/0061; B81B 2207/012; B81B 2207/096; B81B 2201/0257
See application file for complete search history.

(56) References Cited

U.S. PATENT DOCUMENTS

| | | | | |
|---|---|---|---|---|
| 9,282,389 | B1* | 3/2016 | Khenkin | H04R 1/08 |
| 2005/0018864 | A1* | 1/2005 | Minervini | B81B 7/0061 |
| | | | | 381/175 |
| 2005/0189622 | A1 | 9/2005 | Humpston et al. | |
| 2005/0189635 | A1* | 9/2005 | Humpston | B81B 7/0077 |
| | | | | 257/678 |
| 2009/0257614 | A1 | 10/2009 | Mei et al. | |
| 2012/0275634 | A1* | 11/2012 | Leidl | H04R 19/005 |
| | | | | 381/369 |
| 2014/0037115 | A1* | 2/2014 | Vos | H04R 3/00 |
| | | | | 381/174 |
| 2014/0091406 | A1 | 4/2014 | Harney et al. | |
| 2014/0291784 | A1* | 10/2014 | Conklin | H04R 19/04 |
| | | | | 257/416 |
| 2015/0001646 | A1* | 1/2015 | Mueller | H04R 31/00 |
| | | | | 257/416 |
| 2015/0117681 | A1 | 4/2015 | Watson et al. | |
| 2016/0345106 | A1* | 11/2016 | Pahl | H04R 19/04 |

FOREIGN PATENT DOCUMENTS

| | | |
|---|---|---|
| CN | 104080034 A | 10/2014 |
| CN | 105830465 A | 8/2016 |

OTHER PUBLICATIONS

Search Report from corresponding Chinese Patent Application No. 201810057842.9, dated Nov. 21, 2019, 5 pages.

Office Action from corresponding Chinese Patent Application No. 201810057842.9, dated Jul. 10, 2020, 12 pages.

Search Report from corresponding Chinese Patent Application No. 201810057842.9, dated Jul. 10, 2020, 4 pages.

* cited by examiner

MICROELECTROMECHANICAL SYSTEMS PACKAGE STRUCTURE

CROSS-REFERENCE TO RELATED APPLICATIONS

This application claims the benefit of and priority to Taiwan Patent Application No. 106201644, filed Jan. 26, 2017, the contents of which are incorporated herein by reference in its entirety.

BACKGROUND

1. Field of the Disclosure

The present disclosure relates to a package structure, and more particularly to a microelectromechanical systems (MEMS) package structure.

2. Description of the Related Art

A package structure of an MEMS microphone generally includes a substrate, the MEMS microphone, a semiconductor chip and a lid. The MEMS microphone and the semiconductor chip are electrically connected to the substrate, and the lid covers the MEMS microphone and the semiconductor chip. A sufficient volume of space should be provided between the substrate and the lid, such that the MEMS microphone can be provided with a favorable sensitivity. However, to meet the demand of miniaturization, a total thickness of such package structure is reduced. The volume of space between the substrate and the lid is reduced correspondingly, thus adversely affecting the sensitivity of the MEMS microphone.

SUMMARY

In some embodiments, an MEMS package structure includes a first substrate, a transducer unit, a semiconductor chip and a second substrate. The first substrate defines a through hole. The transducer unit is electrically connected to the first substrate, and includes a base and a membrane. The membrane is located between the through hole and the base. The semiconductor chip is electrically connected to the first substrate and the transducer unit. The second substrate is attached to the first substrate and defines a cavity. The transducer unit and the semiconductor chip are disposed in the cavity, and the second substrate is electrically connected to the transducer unit and the semiconductor chip through the first substrate.

In some embodiments, an MEMS package structure includes a substrate, a transducer unit, a semiconductor chip and a lid. The substrate has a first surface and a second surface opposite the first surface, and defines a recess and a through hole. The recess is recessed from the first surface, and the through hole extends through the substrate and communicates with the recess. The transducer unit is disposed in the recess and electrically connected to the first substrate, and includes a base and a membrane. The membrane is located between the through hole and the base. The semiconductor chip is electrically connected to the substrate and the transducer unit. The lid is attached to the substrate and defines a cavity. The transducer unit and the semiconductor chip are disposed in the cavity.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
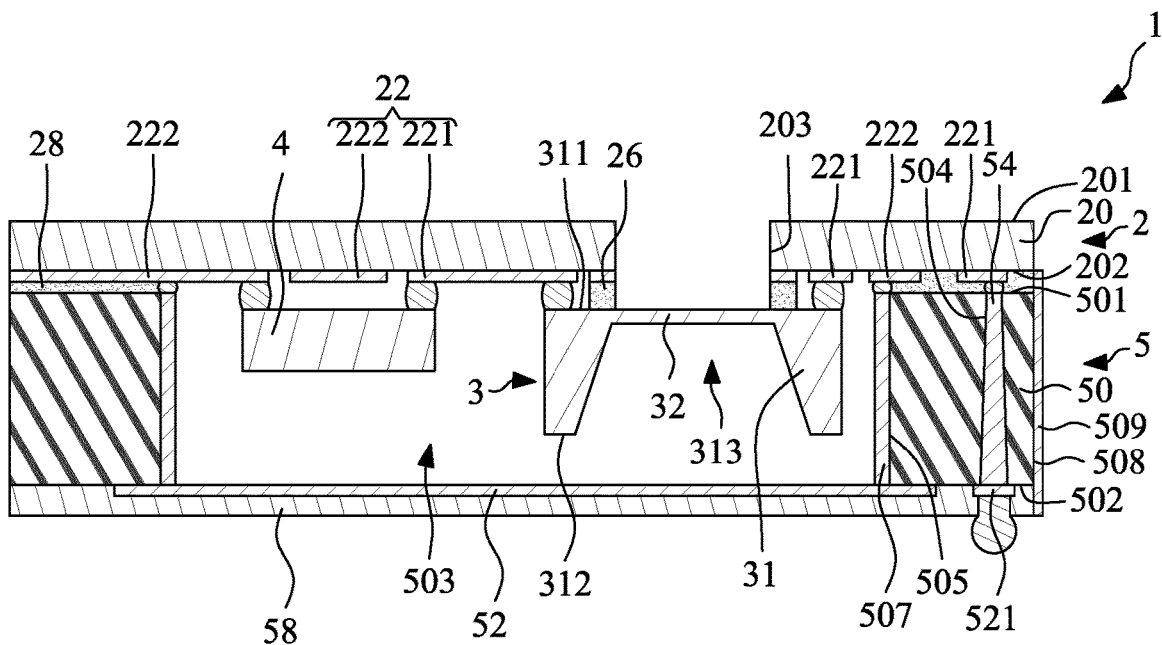
FIG. 1 illustrates a cross-sectional view of an MEMS package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A bottom-port package structure of an MEMS microphone generally includes a substrate, the MEMS microphone, a semiconductor chip and a lid. The substrate defines a through hole. The MEMS microphone is disposed on and electrically connected to the substrate and covers the through hole. The semiconductor chip is also disposed on and electrically connected to the substrate. The lid is attached to the substrate, and covers the MEMS microphone and the semiconductor chip. Similarly, a top-port package structure of an MEMS microphone also includes elements similar to the elements described above, while the through hole, the MEMS microphone and the semiconductor chip are disposed on the lid. Besides, the lid is usually made of a metal. Due to manufacturing process constraints, the lid is provided with a large thickness, thus a total thickness of the package structure increases accordingly.

The MEMS microphone includes a membrane. A front chamber is formed or defined between the membrane and the through hole, and a back chamber is formed or defined between the membrane, the substrate and the lid. In the package structure of the MEMS microphone, a larger volume ratio of the back chamber to the front chamber (a volume of the back chamber/a volume of the front chamber) results in a better sensitivity of the MEMS microphone. However, to meet the demand of miniaturization, a total thickness of such package structure is reduced, resulting in a reduced volume of the back chamber. Consequently, the volume ratio of the back chamber to the front chamber decreases, adversely affect the sensitivity of the MEMS microphone (the sensitivity of the MEMS microphone is lowered). In light of the above, it is desired to reduce the total thickness of the package substrate of the MEMS microphone while maintaining the volume ratio of the back chamber to the front chamber thereof.

FIG. 1 illustrates a cross-sectional view of an MEMS package structure 1 according to some embodiments of the present disclosure. The MEMS package structure 1 includes a first substrate 2, a transducer unit 3, a semiconductor chip 4, a second substrate 5, a first sealant 26 and a second sealant 28.

The first substrate 2 can be a substrate of various types and materials, which are not limited in the present disclosure. The first substrate 2 defines a through hole 203 extending through the first substrate 2. The first substrate 2 includes a first main body 20 and a patterned circuit layer 22. The first main body 20 may be made of an insulating material, such as poly(styrene-butadiene-styrene) (SBS) or another polymer. The patterned circuit layer 22 may be made of a conductive material, such as copper or another metal or metal alloy. The first main body 20 has a first surface 201 and a second surface 202, and defines the through hole 203. The second surface 202 is opposite the first surface 201. The through hole 203 extends through the first main body 20 and between the first surface 201 and the second surface 202. The patterned circuit layer 22 is disposed adjacent to the second surface 202 of the first main body 20, such as disposed directly on or embedded in the second surface 202 of the first main body 20. The patterned circuit layer 22 may include at least one signal section 221 and at least one grounding section 222. It is noted that the grounding section 222 may be adapted for connecting an external grounding contact (not shown). For example, the grounding section 222 may be exposed on a periphery surface of the first main body 20, and can be electrically connected to a grounding contact of a mother board through a conductive component. In some embodiments, as shown in FIG. 1, the first substrate 2 is a flat substrate. However, in other embodiments, the first substrate 2 may be a panel, which includes a plurality of substrate units in an N*M arrangement. For example, the first substrate 2 may include a core layer and two metal layers disposed on an upper surface and a lower surface of the core layer respectively. The metal layer on the upper surface of the core layer may cover the entire upper surface (e.g., a metal layer 24 shown in FIG. 2). The metal layer on the lower surface of the core layer may be patterned to form the patterned circuit layer 22, which includes a large grounding area and traces.

The transducer unit 3 includes a base 31 and a membrane 32, and is electrically connected to the first substrate 2. For example, the transducer unit 3 may be electrically connected to the patterned circuit layer 22 of the first substrate 2, such as electrically connected to the signal section 221 of the patterned circuit layer 22. The base 31 has a first surface 311 and a second surface 312, and defines an opening 313. The second surface 312 is opposite the first surface 311. The opening 313 extends through the base 31 and between the first surface 311 and the second surface 312. The first surface 311 of the base 31 is electrically connected to the patterned circuit layer 22 of the first substrate 2. The membrane 32 is disposed adjacent to the first surface 311 of the base 31 and covers the opening 313, thus forming a semi-closed space. That is, the membrane 32 is located between the through hole 203 of the first substrate 2 and the base 31, and the membrane 32 is closer to the first substrate 2 than is the opening 313. In some embodiments, as shown in FIG. 1, the transducer unit 3 may be an MEMS microphone attached to the first substrate 2 in a flip-chip manner (e.g., via flip-chip bonding), such that the membrane 32 is located between the through hole 203 of the first substrate 2 and the base 31. In other embodiments, the transducer unit 3 may be electrically connected to the first substrate 2 through wire-bonding. A front chamber is formed or defined between the membrane 32 of the transducer unit 3 and the through hole 203 of the first substrate 2. In the case that the transducer unit 3 is attached to the first substrate 2 in a flip-chip manner, as shown in FIG. 1, the membrane 32 is closer to the through hole 203, such that the front chamber is provided with a smaller volume. In other words, on the premise that a total volume of the MEMS package structure 1 remains the same, when the transducer unit 3 is attached to the first substrate 2 in a flip-chip manner, a portion of the front chamber transforms into a portion of a back chamber. Thus, a volume of the front chamber decreases, while a volume of the back chamber increases accordingly. Consequently, a volume ratio of the back chamber to the front chamber increases, thus improving the signal-to-noise ratio of the MEMS microphone. In other embodiments, the transducer unit 3 is electrically connected to the first substrate 2 through wire-bonding, thus the volume of the front chamber is relatively larger.

The semiconductor chip 4 may be an application-specific integrated circuit (ASIC) chip for providing a stable bias to the transducer unit 3, and amplifying and outputting signals from the transducer unit 3. The semiconductor chip 4 is electrically connected to the first substrate 2 and the transducer unit 3, such as electrically connected to the signal section 221 of the patterned circuit layer 22 of the first substrate 2, so as to be electrically connected to the transducer unit 3. In some embodiments, the semiconductor chip 4 is attached to the first substrate 2 in a flip-chip manner. However, in other embodiments, the semiconductor chip 4 may be electrically connected to the first substrate 2 through wire-bonding.

The second substrate 5 may be a substrate of various types and materials, and may be the same as or different from that of the first substrate 2. The second substrate 5 defines a cavity 503 which does not extend through the second substrate 5. The second substrate 5 may include a second main body 50, a conductive layer 52, at least one signal via 54 and a protection layer 58. The second main body 50 defines the cavity 503, and has a first surface 501 and a second surface 502. The second surface 502 is opposite the first surface 501. In some embodiments, as shown in FIG. 1, the cavity 503 extends through the second main body 50, and extends from the first surface 501 to the second surface 502. However, in other embodiments, the cavity 503 may not extend fully through the second main body 50.

The conductive layer 52 is disposed adjacent the second surface 502 of the second main body 50, such as disposed directly on or embedded in the second surface 502. The conductive layer 52 includes at least one first bump pad 521 for external connection. The second main body 50 may be made of an insulating material, such as SBS or another polymer. The conductive layer 52 may be made of a conductive material, such as copper or another metal or metal alloy. The cavity 503 may be formed by an etching process. In some embodiments, the conductive layer 52 is an outermost conductive layer of the second substrate 5, and a portion of the conductive layer 52 is exposed in the cavity 503.

The signal via 54 is located within the second main body 50. The signal via 54 has an end connecting to the signal section 221 of the patterned circuit layer 22, and another end connecting to the first bump pad 521. A material of the signal via 54 may be a conductive material, such as copper or another metal or metal alloy. For example, the second main body 50 may define at least one first via hole 504 extending through the second main body 50 and between the first surface 501 and the second surface 502, and the signal via 54 is disposed in the first via hole 504.

The second substrate 5 is attached to the first substrate 2 (e.g., attached to the second surface 202 of the first main body 20), such that the transducer unit 3 and the semiconductor chip 4 are disposed in the cavity 503, and the opening 313 of the transducer unit 3 communicates with the cavity 503. The second substrate 5 is electrically connected to the transducer unit 3 and the semiconductor chip 4 through the first substrate 2, such as through the signal via 54 and the signal section 221 of the patterned circuit layer 22. Hence, signals from the semiconductor chip 4 may be outputted through the signal section 221 of the patterned circuit layer 22, the signal via 54 and the first bump pad 521. The protection layer 58 covers at least a portion of the conductive layer 52 and the second surface 502 of the second main body 50. The protection layer 58 is made of an insulating material, such as a solder mask, and may be the same as or different from the material of the second main body 50. The first bump pad 521 is not covered by, or is exposed from, the protection layer 58, and a solder ball or other conductive bump may be formed thereon. For example, the solder ball may further connect to a mother board.

Besides, the second substrate 5 further includes an inner wall 505, an inner shielding layer 507, a periphery surface 508 and an outer shielding layer 509. The inner wall 505 defines and faces the cavity 503, and the inner shielding layer 507 is disposed on the inner wall 505. For example, the inner shielding layer 507 may include a copper layer attached to the inner wall 505, and a stainless steel layer attached to the copper layer. Due to the conductivity of the copper layer, the transducer unit 3 and the semiconductor chip 4 may be shielded from interferences caused by external electromagnetic field, thus reducing noise. The stainless steel layer can prevent the copper layer from rust and peeling. Besides, the inner shielding layer 507 may be electrically connected to the grounding section 222 of the patterned circuit layer 22 of the first substrate 2 and the conductive layer 52 of the second substrate 5. The inner shielding layer 507 may include layers made of other metals or metal alloys. The outer shielding layer 509 is disposed on the periphery surface 508. In some embodiments, the outer shielding layer 509 selectively covers a portion of the periphery surface 508 adjacent to the signal via 54 for noise reduction. Alternatively, the outer shielding layer 509 may cover the entire periphery surface 508. Further, the outer shielding layer 509 may be electrically connected to the grounding section 222 of the patterned circuit layer 22 of the first substrate 2 and the conductive layer 52 of the second substrate 5 for grounding purpose.

A material of the first sealant 26 may be the same as, or different from, a material of the second sealant 28. The first sealant 26 is disposed between the first surface 311 of the base 31 of the transducer unit 3 and the second surface 202 of the first main body 20 of the first substrate 2, and surrounds the membrane 32 of the transducer unit 3. The second sealant 28 is disposed between the second surface 202 of the first main body 20 of the first substrate 2 and the first surface 501 of the second main body 50 of the second substrate 5. The arrangement of the first sealant 26 and the second sealant 28 ensures a closed space formed between the membrane 32 of the transducer unit 3, the first substrate 2 and the second substrate 5. That is, the closed space is defined by the opening 313 of the base 31 of the transducer unit 3 and the cavity 503 of the second substrate 5.

In some embodiments, as shown in FIG. 1, the front chamber is formed between the membrane 32 of the transducer unit 3 and the through hole 203 of the first substrate 2, and the back chamber is formed between the first substrate 2 and the second substrate 5 (e.g., composed of the opening 313 of the base 31 of the transducer unit 3 and the cavity 503 of the second substrate 5). Since the membrane 32 of the transducer unit 3 is located between the through hole 203 of the first substrate 2 and the base 31, the membrane 32 is closer to the through hole 203, forming a smaller volume of the front chamber. Accordingly, even if a total thickness of the MEMS package structure 1 is reduced which results in a reduced volume of the back chamber, the volume ratio of the back chamber to the front chamber may still be maintained large. Besides, in an MEMS microphone package structure of a comparative embodiment, a lid thereof is generally made of a metal or made by metal sputtering after molding, which has a greater thickness due to process constraints, thus a total thickness of the package structure increases correspondingly, and cannot be sufficiently reduced. In some embodiments, as shown in FIG. 1, since the lid described above is replaced by the second substrate 5, and a thickness of the conductive layer 52 and the protection layer 58 is significantly less than the thickness of the lid, a total thickness of the MEMS package structure 1 can be further reduced. In the MEMS package structure 1, since the first substrate 2 is a flat substrate, and the transducer unit 3 and the semiconductor chip 4 are attached to the flat first substrate 2, the manufacturing process thereof can be simplified. Besides, when the MEMS package structure 1 is assembled to a mother board, the through hole 203 can face directly to a voice source, improving voice reception of the MEMS package structure 1.

Figure 2:
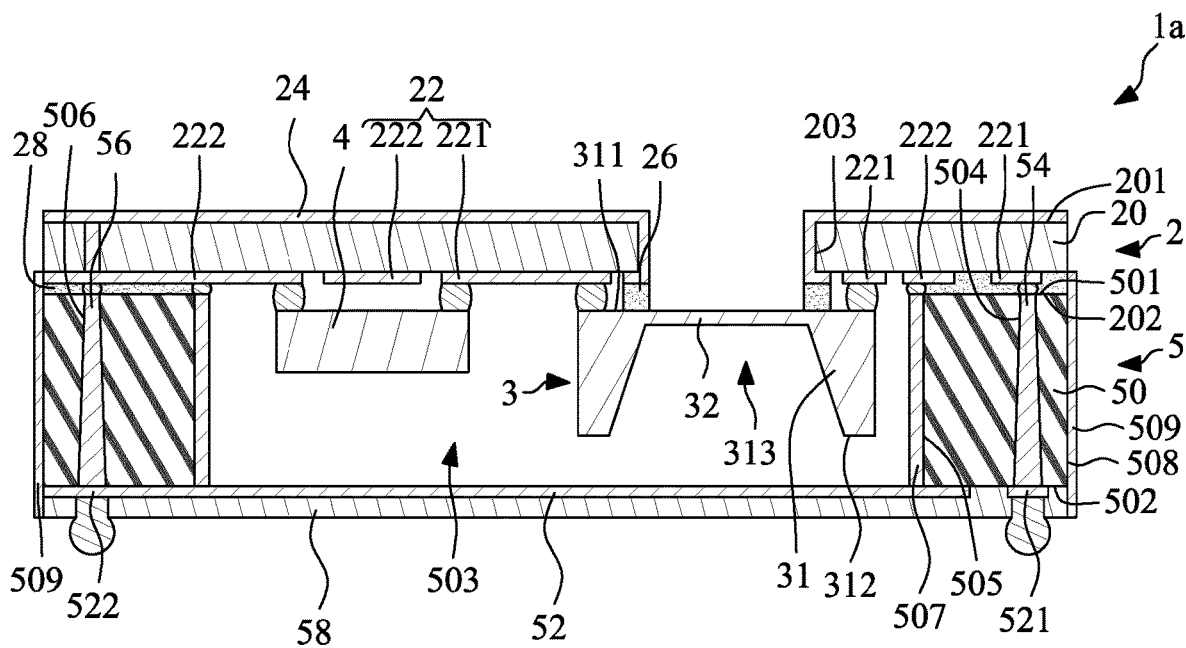
FIG. 2 illustrates a cross-sectional view of an MEMS package structure according to some embodiments of the present disclosure.

FIG. 2 illustrates a cross-sectional view of an MEMS package structure 1a according to some embodiments of the present disclosure. The structure of the MEMS package structure 1a is similar to that of the MEMS package structure 1 of FIG. 1, except that the MEMS package structure 1a further includes a metal layer 24 disposed adjacent to the first surface 201 of the first main body 20. Since the patterned circuit layer 22 of the first substrate 2 is adjacent to the second surface 202, a large portion of the first surface 201 may be covered by the metal layer 24. For example, an area of the metal layer 24 may be greater than about half of an area of the first surface 201 (e.g., about ⅔ or greater, or about ¾ or greater), so that the metal layer 24 can provide an excellent electromagnetic shielding effect. It is noted that the metal layer 24 may be electrically connected to the grounding section 222 of the patterned circuit layer 22. In some embodiments, the metal layer 24 may extend into the through hole 203 of the first substrate 2. In other embodiments, the metal layer 24 covers the entire first surface 201 for maximizing the electromagnetic shielding effect. Besides, the metal layer 24 is exposed on a periphery surface of the MEMS package structure 1a, and a marking process can be directly conducted on the metal layer 24, providing the MEMS package structure 1a with a favorable appearance.

Further, the second substrate 5 may include at least one grounding via 56 located within the second main body 50. In some embodiments, the signal via 54 and the grounding via 56 are respectively disposed at two opposite sides of the second substrate 5. However, the grounding via 56 may be disposed adjacent to the signal via 54. For example, the second main body 50 may define at least one second via hole 506 extending through the second main body 50 and between the first surface 501 and the second surface 502. The grounding via 56 is disposed in the second via hole 506. The conductive layer 52 may correspondingly include at least one second bump pad 522. The grounding via 56 has an end electrically connected to the first substrate 5 (e.g., electrically connected to the grounding section 222 of the patterned circuit layer 22 and the metal layer 24), and another end electrically connected to the second bump pad 522. Similar to the first bump pad 521, the second bump pad 522 is not covered by, or is exposed from, the protection layer 58, and a solder ball or other conductive bump may be disposed thereon and may connect to a mother board. In some embodiments, as shown in FIG. 2, the second bump pad 522 is also electrically connected to the conductive layer 52 and the inner shielding layer 507.

Figure 3:
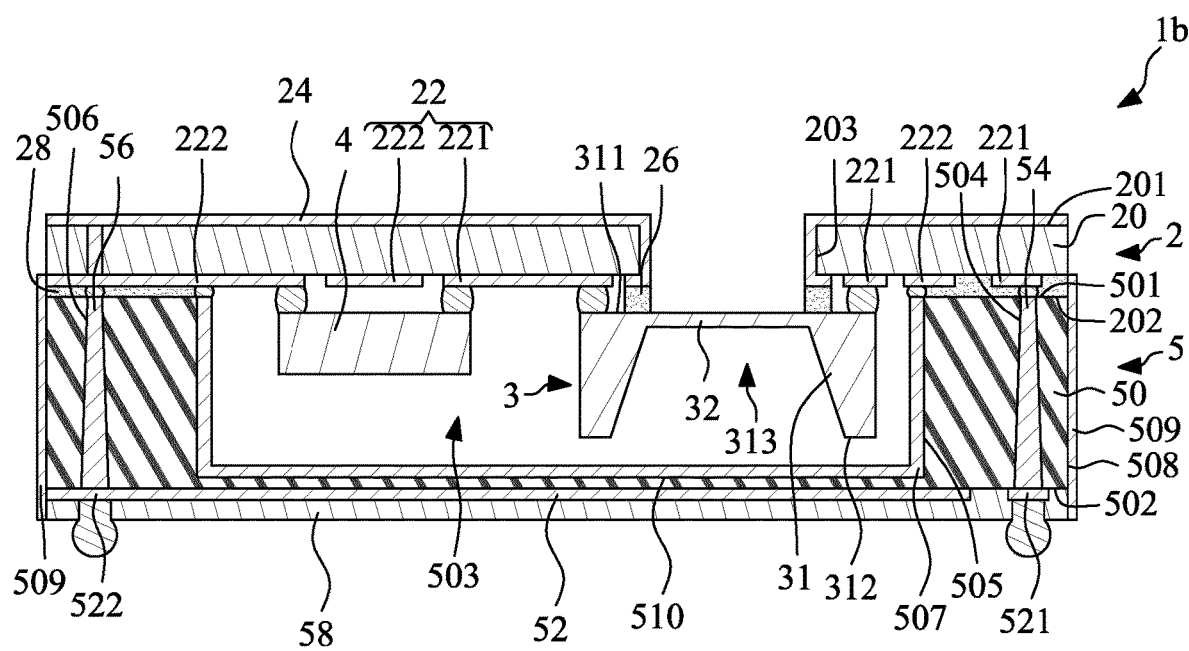
FIG. 3 illustrates a cross-sectional view of an MEMS package structure according to some embodiments of the present disclosure.

FIG. 3 illustrates a cross-sectional view of an MEMS package structure 1b according to some embodiments of the present disclosure. The structure of the MEMS package structure 1b is similar to that of the MEMS package structure 1a of FIG. 2, except that the conductive layer 52 of the second substrate 5 of the MEMS package structure 1b is not exposed in the cavity 503. The cavity 503 is further defined by a bottom wall 510 of the second main body 50, and the inner shielding layer 507 covers the inner wall 505 and the bottom wall 510 of the second main body 50. In some embodiments, the second substrate 5 may be etched to form the cavity 503, thus the progress of etching may be controlled to form different arrangements of the cavity 503. For example, the second substrate 5 may be etched until a portion of the conductive layer 52 is exposed in the cavity 503, as shown in FIGS. 1 and 2. Alternatively, the progress of etching of the second substrate 5 may be stopped earlier, such that the conductive layer 52 is not exposed in the cavity 503. Hence, the entire conductive layer 52 is sandwiched between the second main body 50 and the protection layer 58.

Figure 4:
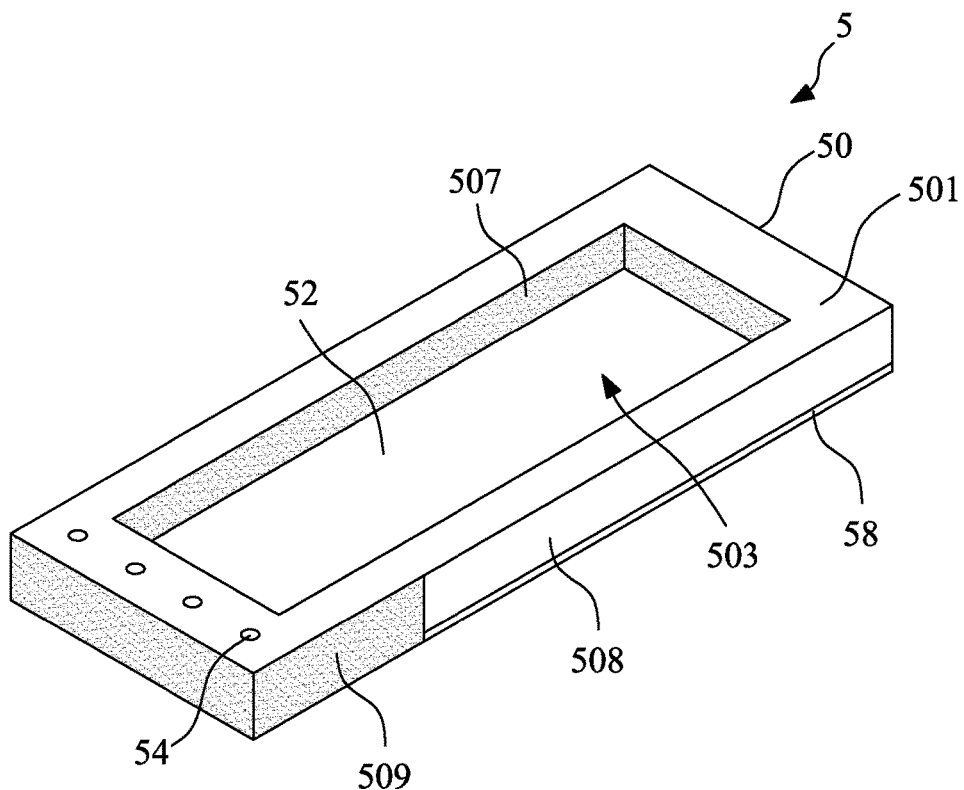
FIG. 4 illustrates a perspective view of a second substrate of an MEMS package structure according to some embodiments of the present disclosure.

FIG. 4 illustrates a perspective view of the second substrate 5 of an MEMS package structure according to some embodiments of the present disclosure. In some embodiments, as shown in FIG. 4, the second substrate 5 is substantially in a shape of a rectangular box. However, the shape of the second substrate 5 is not limited in the present disclosure. Similar to the above, the second substrate 5 defines the cavity 503, and includes the plurality of signal via 54 extending to the first surface 501. FIG. 4 shows four signal vias 54, while a number of the signal vias 54 may be varied according to design specifications, and is not limited thereto. The second substrate 5 includes the inner shielding layer 507 and the outer shielding layer 509. The outer shielding layer 509 is formed by selectively coating on a portion of the periphery surface 508 adjacent to the signal vias 54, or on the entire periphery surface 508.

Figure 5:
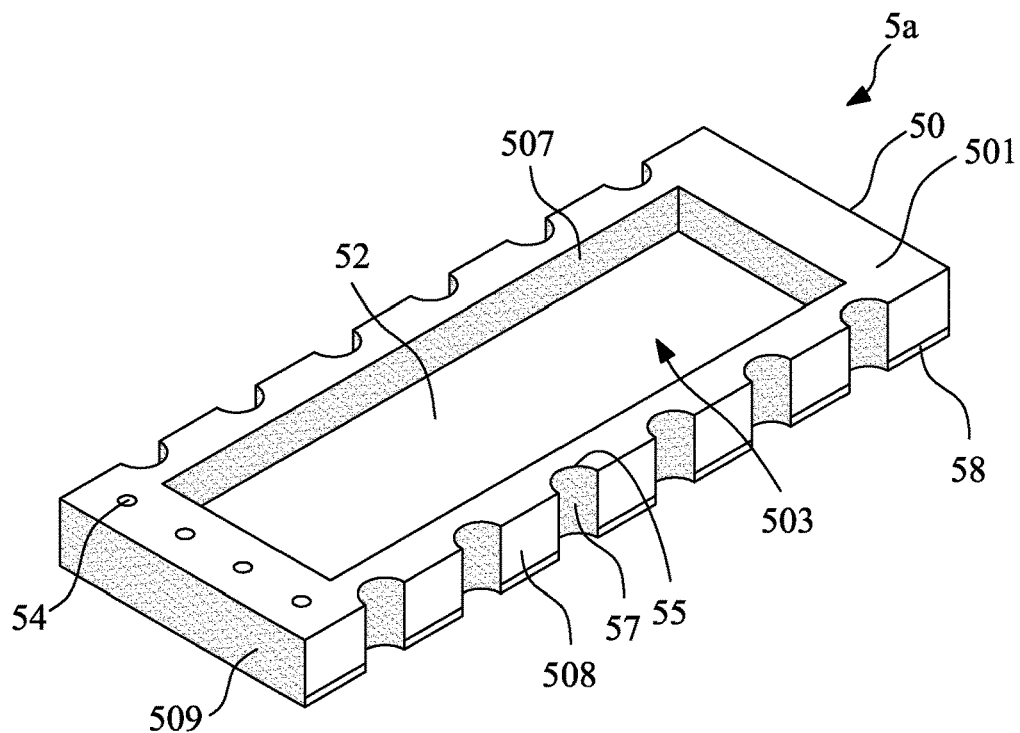
FIG. 5 illustrates a perspective view of a second substrate of an MEMS package structure according to some embodiments of the present disclosure.

FIG. 5 illustrates a perspective view of a second substrate 5a of an MEMS package structure according to some embodiments of the present disclosure. The structure of the second substrate 5a is similar to that of the second substrate 5 of FIG. 4, except that the second substrate 5a further includes a plurality of conductive vias 57 exposed from the periphery surface 508 of the second main body 50. The conductive vias 57 may include one or more signal vias and/or one or more grounding vias. In some embodiments, as shown in FIG. 5, the second substrate 5a further defines a plurality of grooves 55 extending through the second substrate 5a, and disposed on the periphery surface 508 of the second main body 50. As shown in FIG. 5, each of the grooves 55 is substantially in a semi-cylindrical shape from a top view. Each of the conductive vias 57 is substantially a thin film made of a conductive material and attached to an inner wall surface of a respective groove 55.

Figure 6:
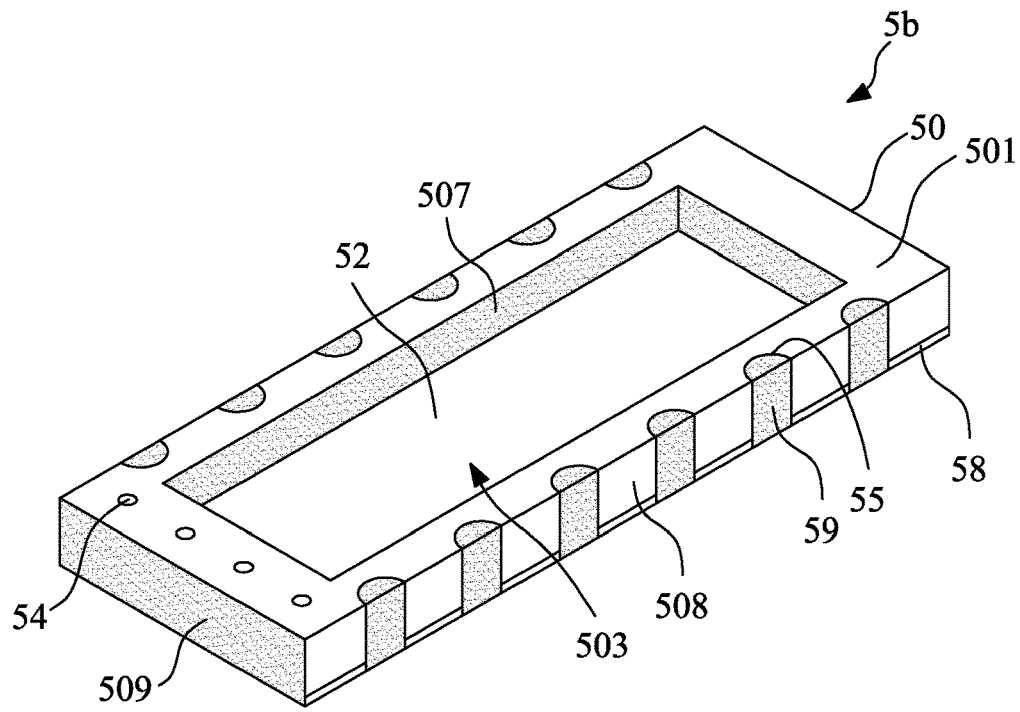
FIG. 6 illustrates a perspective view of a second substrate of an MEMS package structure according to some embodiments of the present disclosure.

FIG. 6 illustrates a perspective view of a second substrate 5b of an MEMS package structure according to some embodiments of the present disclosure. The structure of the second substrate 5b is similar to that of the second substrate 5a of FIG. 5, except that a conductive material fills each of the plurality of grooves 55 of the second substrate 5b shown in FIG. 6, forming a plurality of conductive vias 59. The conductive vias 59 may include one or more signal vias and/or one or more grounding vias. As shown in FIG. 6, each of the conductive vias 59 is substantially in a semi-cylindrical shape. A portion of each of the conductive vias 59 is exposed from the periphery surface 508 of the second main body 50. In some embodiments, an outer surface of each of the conductive vias 59 is substantially coplanar with the periphery surface 508 of the second main body 50.

Figure 7:
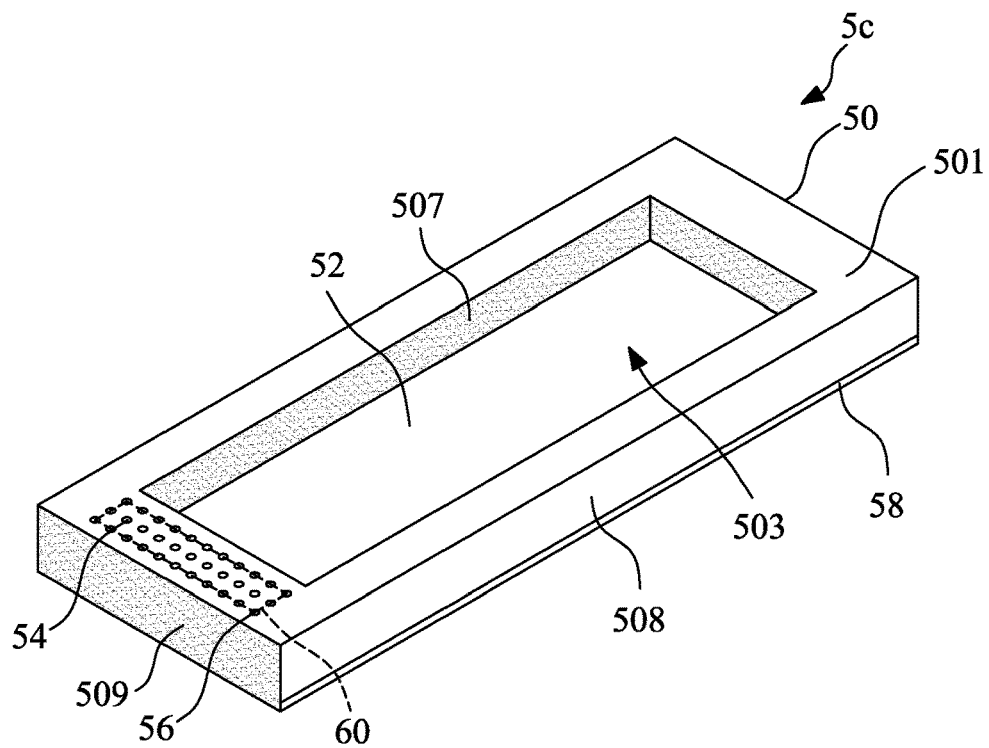
FIG. 7 illustrates a perspective view of a second substrate of an MEMS package structure according to some embodiments of the present disclosure.

FIG. 7 illustrates a perspective view of a second substrate 5c of an MEMS package structure according to some embodiments of the present disclosure. The structure of the second substrate 5c is similar to that of the second substrate 5 of FIG. 4, except that the second substrate 5c shown in FIG. 7 includes a plurality of signal vias 54 and a plurality of grounding vias 56, and the grounding vias 56 surround the signal vias 54 for electromagnetic shielding purpose. As shown in FIG. 7, the grounding vias 56 are arranged in an outer ring 60, and the signal vias 54 are located within the outer ring 60.

Figure 8:
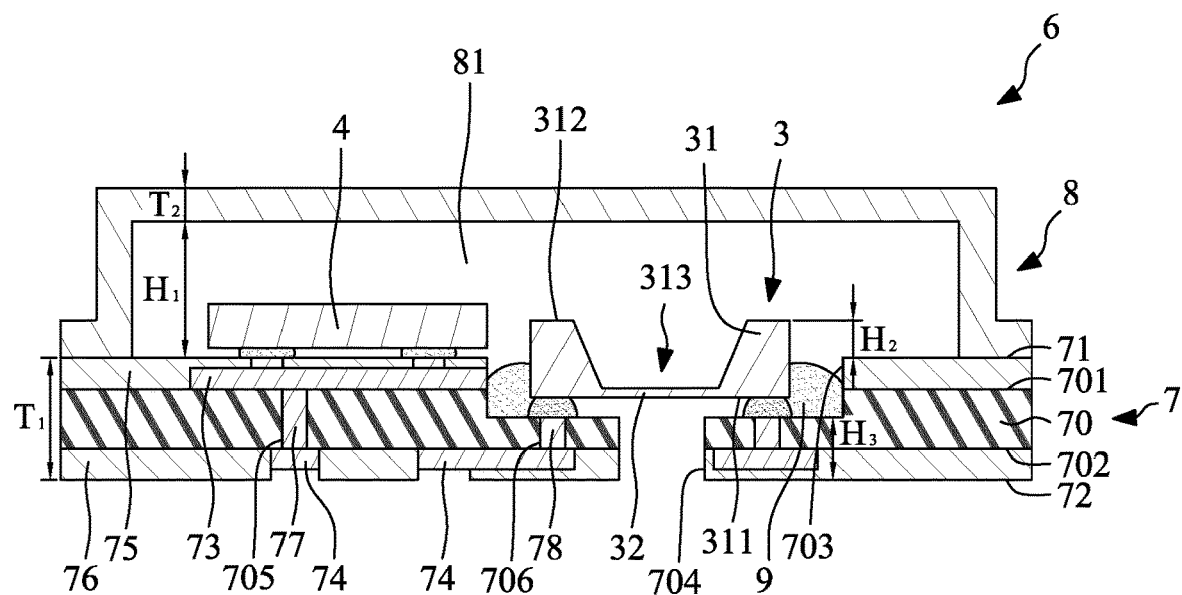
FIG. 8 illustrates a cross-sectional view of an MEMS package structure according to some embodiments of the present disclosure.

FIG. 8 illustrates a cross-sectional view of an MEMS package structure 6 according to some embodiments of the present disclosure. The MEMS package structure 6 includes a substrate 7, a transducer unit 3, a semiconductor chip 4, a lid 8 and a protective material 9.

The substrate 7 can be a substrate of various types and materials, which are not limited in the present disclosure. The substrate 7 has a first surface 71 and a second surface 72, and defines a recess 703 and a through hole 704. The second surface 72 is opposite the first surface 71. The recess 703 is recessed from the first surface 71 but not reaching the second surface 72. That is, the recess 703 does not fully extend through the substrate 7. The through hole 704 is disposed below the recess 703 and extends through the substrate 7. The through hole 704 communicates with the recess 703, and a width of the through hole 704 is less than a width of the recess 703 (e.g., about half or less, or about ⅓ or less). In some embodiments, the substrate 7 includes a main body 70, a first patterned circuit layer 73, a second patterned circuit layer 74, a first protection layer 75, a second protection layer 76, at least one first conductive via 77 and at least one second conductive via 78. The main body 70 may be made of an insulating material, such as SBS or another polymer. The first patterned circuit layer 73 and the second patterned circuit layer 74 may be made of a conductive material, such as copper or another metal or metal alloy.

The main body 70 has a first surface 701 and a second surface 702, and defines the recess 703 and the through hole 704. The second surface 702 of the main body 70 is opposite the first surface 701 of the main body 70. The first patterned circuit layer 73 is disposed adjacent to the first surface 701 of the main body 70, such as disposed directly on or embedded in the first surface 701 of the main body 70. The second patterned circuit layer 74 is disposed adjacent to the second surface 702 of the main body 70, such as disposed directly on or embedded in the second surface 702 of the main body 70, and is electrically connected to the first patterned circuit layer 73.

The first protection layer 75 covers at least a portion of the first patterned circuit layer 73 and the first surface 701 of the main body 70. The second protection layer 76 covers at least a portion of the second patterned circuit layer 74 and the second surface 702 of the main body 70. The first protection layer 75 and the second protection layer 76 may be made of an insulating material, such as a solder mask, and a material of the first protection layer 75 may be the same as or different from a material of the second protection layer 76. An upper surface of the first protection layer 75 corresponds to the first surface 71 of the substrate 7. A lower surface of the second protection layer 76 corresponds to the second surface 72 of the substrate 7. The first conductive via 77 is adapted for electrically connecting the first patterned circuit layer 73 and the second patterned circuit layer 74. For example, the main body 70 may define at least one first via hole 705 extending through the main body 70, and the first conductive via 77 may be disposed in the first via hole 705. The second conductive via 78 is disposed below the transducer unit 3, and is adapted for electrically connecting the second patterned circuit layer 74 and the transducer unit 3. For example, the main body 70 may define at least one second via hole 706 extending through the main body 70 and communicating with the recess 703, and the second conductive via 78 may be disposed in the second via hole 706. The first conductive via 77 and the second conductive via 78 may include a signal via and/or a grounding via.

The transducer unit 3 includes a base 31 and a membrane 32. The transducer unit 3 is disposed in the recess 703 and electrically connected to the substrate 7. For example, the transducer unit 3 may be electrically connected to another end of the second conductive via 78, so as to be electrically connected to the second patterned circuit layer 74 through the second conductive via 78. That is, the second conductive via 78 electrically connects the second patterned circuit layer 74 and the transducer unit 3. The base 31 has a first surface 311 and a second surface 312, and defines an opening 313. The second surface 312 is opposite the first surface 311. The opening 313 extends through the base 31 and between the first surface 311 and the second surface 312. The first surface 311 of the base 31 is electrically connected to the second patterned circuit layer 74 of the substrate 7. The membrane 32 is disposed adjacent to the first surface 311 of the base 31 and covers the opening 313, thus forming a semi-closed space. That is, the membrane 32 is located between the through hole 704 of the substrate 7 and the base 31, and is closer to the through hole 704 of the substrate 7 than is the opening 313. In some embodiments, as shown in FIG. 8, the transducer unit 3 may be an MEMS microphone attached to the substrate 7 in a flip-chip manner, such that the membrane 32 is located between the through hole 704 of the substrate 7 and the base 31. In other embodiments, the transducer unit 3 may be electrically connected to the substrate 7 through wire-bonding.

The semiconductor chip 4 may be an ASIC chip for providing a stable bias to the transducer unit 3, and amplifying and outputting signals from the transducer unit 3. The semiconductor chip 4 is electrically connected to the substrate 7 and the transducer unit 3, such as disposed adjacent to the first surface 71 of the substrate 7 and electrically connected to the first patterned circuit layer 73 of the substrate 7. The semiconductor chip 4 is electrically connected to the transducer unit 3 through the first patterned circuit layer 73, the first conductive via 77 and the second patterned circuit layer 74. In some embodiments, as shown in FIG. 8, the semiconductor chip 4 is attached to the substrate 7 in a flip-chip manner. However, in other embodiments, the semiconductor chip 4 may be electrically connected to the substrate 7 through wire-bonding.

The lid 8 may include a conductive layer or may be made of a conductive material for electromagnetic shielding purpose, although a material of the lid 8 is not limited in the present disclosure. The lid 8 defines a cavity 81, and is attached (e.g., by adhesion) to the first surface 71 of the substrate 7. The transducer unit 3 and the semiconductor chip 4 are disposed in the cavity 81. The opening 313 of the transducer unit 3 may communicate with the cavity 81 of the lid 8.

The protective material 9 is disposed between an outer surface of the transducer unit 3 and an inner surface of the recess 703, such that a closed space is formed between the membrane 32, the substrate 7 and the lid 8. That is, the closed space is defined by the opening 313 of the base 31 of the transducer unit 3 and the cavity 81 of the lid 8.

In some embodiments, a thickness $T_1$ of the substrate 7 is about 200 μm, and a thickness $T_2$ of the lid 8 is about 100 μm. A height difference $H_1$ between an inner wall of the lid 8 to the first surface 71 of the substrate 7 is about 300 μm. A height difference $H_2$ between the second surface 312 of the base 31 of the transducer unit 3 to the first surface 71 of the substrate 7 is about 270 μm. A height difference $H_3$ between a bottom surface of the recess 703 to the second surface 72 of the substrate 7 is about 100 μm. Accordingly, a total thickness of the MEMS package substrate 6 (e.g., a maximum height difference between an upper surface of the lid 8 to the second surface 72 of the substrate 7, which is $T_2+H_1+T_1$) is about 600 μm. In another embodiment where the recess 703 is omitted, a total thickness of such MEMS package substrate is about 950 μm.

In some embodiments, as shown in FIG. 8, a front chamber is formed between the membrane 32 of the transducer unit 3 and the through hole 704 of the substrate 7, and a back chamber is formed between the membrane 32, the substrate 7 and the lid 8 (e.g., composed of the opening 313 of the base 31 of the transducer unit 3 and the cavity 81 of the lid 8). Since the membrane 32 of the transducer unit 3 is located between the through hole 704 of the substrate 7 and the base 31, the membrane 32 is closer to the second surface 72 of the substrate 7, forming a smaller volume of the front chamber. Accordingly, even if a total thickness of the MEMS package structure 6 is reduced which results in a reduced volume of the back chamber, a volume ratio of the back chamber to the front chamber may still be maintained large. Besides, since the substrate 7 defines the recess 703 and the transducer unit 3 is disposed in the recess 703, a total thickness of the MEMS package structure 6 may be further reduced.

Figure 9:
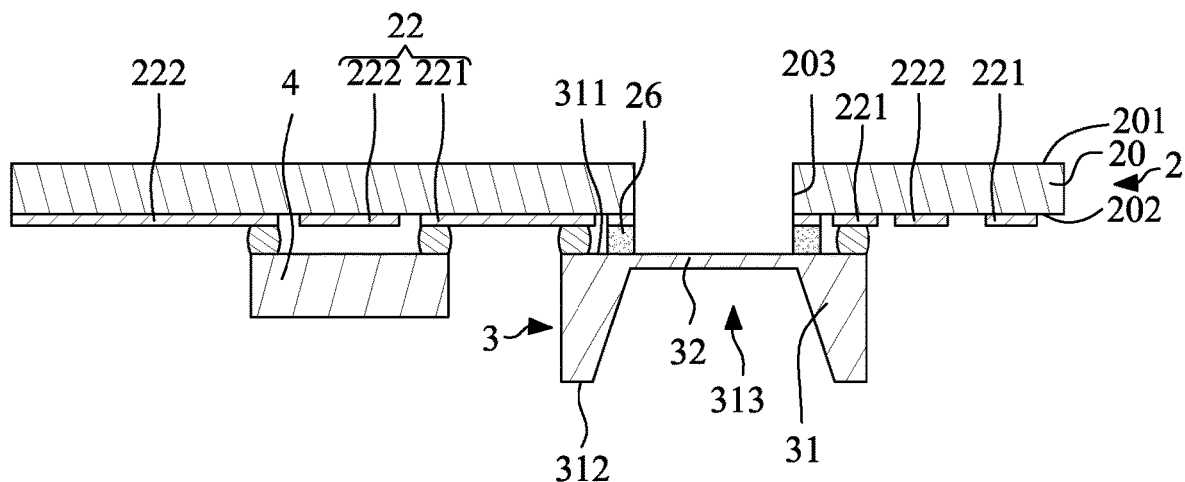
FIG. 9 illustrates one or more stages of an example of a method for manufacturing an MEMS package structure according to some embodiments of the present disclosure.
Figure 10:
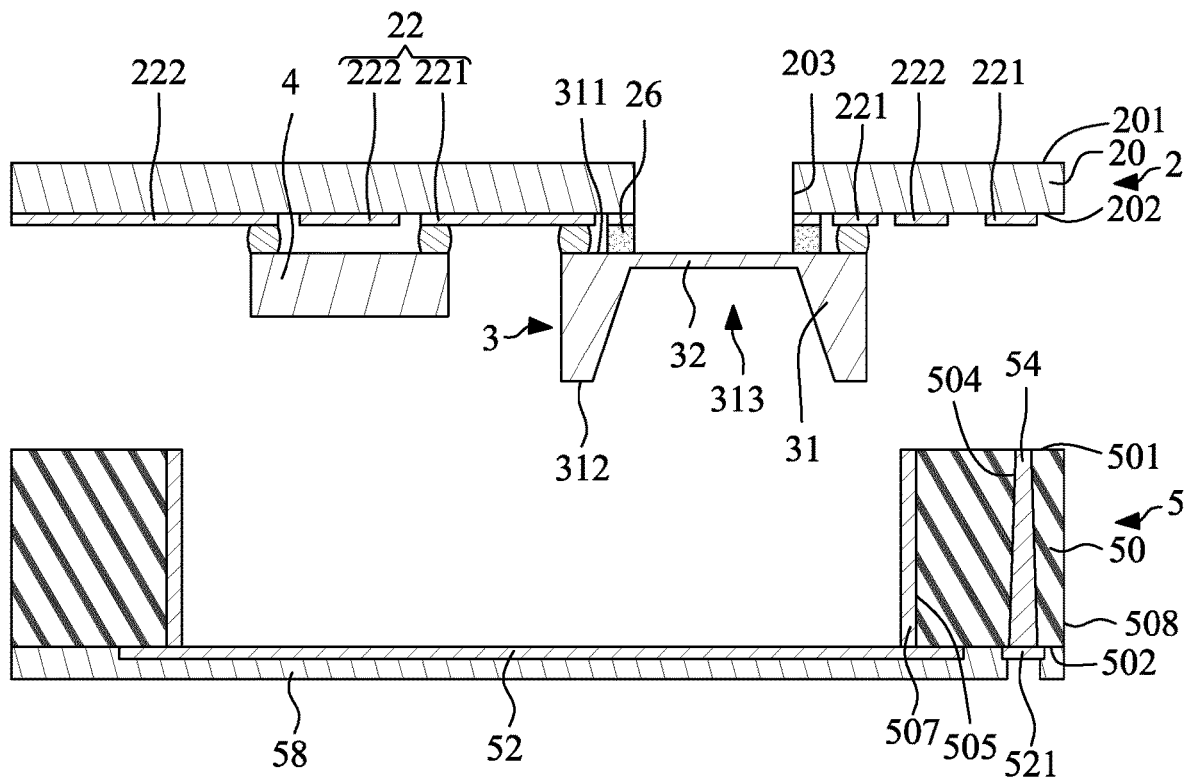
FIG. 10 illustrates one or more stages of an example of a method for manufacturing an MEMS package structure according to some embodiments of the present disclosure.

FIG. 9 and FIG. 10 illustrate a method for manufacturing an MEMS package structure according to some embodiments of the present disclosure. In some embodiments, the method is for manufacturing the MEMS package structure 1 shown in FIG. 1. Referring to FIG. 9, a first substrate 2 (e.g., the first substrate 2 shown in FIG. 1) is provided, which defines a through hole 203. Then, a transducer unit 3 (e.g., the transducer unit 3 shown in FIG. 1) is provided, which includes a base 31 and a membrane 32. The transducer unit 3 is electrically connected to the first substrate 2, and the membrane 32 is located between the through hole 203 of the first substrate 2 and the base 31. Then, a semiconductor chip 4 (e.g., the semiconductor chip 4 shown in FIG. 1) is electrically connected to the first substrate 2 and the transducer unit 3. In some embodiments, as shown in FIG. 9, the first substrate 2 includes a patterned circuit layer 22. The transducer unit 3 and the semiconductor chip 4 are attached to the first substrate 2 in a flip-chip manner, such that the transducer unit 3 and the semiconductor chip 4 are electrically connected to the patterned circuit layer 22 of the first substrate 2. That is, the semiconductor chip 4 is electrically connected to the transducer unit 3 through the patterned circuit layer 22. Then, a first sealant 26 (e.g., the first sealant 26 shown in FIG. 1) is filled in a gap between the transducer unit 3 and the first substrate 2.

Referring to FIG. 10, a second substrate 5 (e.g., the second substrate 5 shown in FIG. 1) is provided, which defines a cavity (e.g., the cavity 503 shown in FIG. 1). Then, the second substrate 5 is attached to the first substrate 2, such that the transducer unit 3 and the semiconductor chip 4 are disposed in the cavity of the second substrate 5, and the second substrate 5 is electrically connected to the first substrate 2. The second substrate 5 includes at least one signal via 54, which may be electrically connected to the patterned circuit layer 22 of the first substrate 2 through welding, such that the second substrate 5 may be electrically connected to the semiconductor chip 4 and the transducer unit 3 through the signal via 54. Then, a second sealant (e.g., the second sealant 28 shown in FIG. 1) is filled in between the first substrate 2 and the second substrate 5, such that a closed space is formed between the membrane 32 of the transducer unit 3, the first substrate 2 and the second substrate 5. Then, an outer shielding layer (e.g., the outer shielding layer 509 shown in FIG. 1) is formed on a periphery surface 508 of the second substrate 5, thus forming the MEMS package structure 1 as shown in FIG. 1.

In the manufacturing method shown in FIGS. 9 and 10, since the second substrate 5 can be adapted for external connection, the manufacturing process of the MEMS package structure 1 can be simplified, reducing production cost thereof.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A microelectromechanical systems (MEMS) package structure, comprising:
   a first substrate defining a through hole;

a transducer unit electrically connected to the first substrate, and including a base and a membrane, wherein the membrane is located between the through hole and the base;

a semiconductor chip electrically connected to the first substrate and the transducer unit; and a second substrate attached to the first substrate and defining a cavity, wherein the second substrate has a first surface and a second surface opposite the first surface, the cavity is recessed from the first surface of the second substrate, the cavity does not extend through the second substrate, the transducer unit and the chip are disposed in the cavity, the second substrate is electrically connected to the transducer unit and the semiconductor chip through the first substrate, and the second substrate comprises a first bump pad exposed on the second surface for outputting signals from the semiconductor chip.

2. The MEMS package structure of claim 1, wherein the through hole of the first substrate extends through the first substrate.

3. The MEMS package structure of claim 1, wherein the first substrate includes a first main body and a patterned circuit layer, the first main body has a first surface and a second surface opposite the first surface, and defines the through hole, the patterned circuit layer is disposed adjacent the second surface of the first main body, and the transducer and the semiconductor chip are electrically connected to the patterned circuit layer.

4. The MEMS package structure of claim 3, wherein the first substrate further includes a metal layer disposed adjacent the first surface of the first main body.

5. The MEMS package structure of claim 4, wherein an area of the metal layer is greater than half of an area of the first surface of the first main body.

6. The MEMS package structure of claim 1, wherein the transducer unit is an MEMS microphone.

7. The MEMS package structure of claim 1, wherein the transducer unit is attached to the first substrate via flip-chip bonding.

8. The MEMS package structure of claim 1, wherein the base has a first surface and a second surface opposite the first surface, and defines an opening extending through the base, the membrane is disposed adjacent the first surface and covers the opening, and the first surface of the base is electrically connected to the first substrate.

9. The MEMS package structure of claim 1, wherein the base defines an opening extending through the base, the membrane covers the opening, and the opening communicates with the cavity of the second substrate.

10. The MEMS package structure of claim 1, wherein the base defines an opening extending through the base, the membrane covers the opening, and the membrane is closer to the first substrate than is the opening.

11. The MEMS package structure of claim 1, wherein the semiconductor chip is attached to the first substrate via flip-chip bonding.

12. The MEMS package structure of claim 1, wherein the second substrate includes a second main body, a conductive layer and at least one signal via, the second main body has a first surface and a second surface opposite the first surface, the conductive layer is disposed adjacent the second surface of the second main body and includes the first bump pad for external connection, the signal via is located within the second main body and has an end electrically connected to the first substrate and another end electrically connected to the first bump pad.

13. The MEMS package structure of claim 12, wherein the second main body further defines at least one first via hole extending through the second main body, and the signal via is disposed in the first via hole.

14. The MEMS package structure of claim 12, wherein the second main body defines the cavity, and a portion of the conductive layer is exposed in the cavity.

15. The MEMS package structure of claim 12, wherein the second substrate further includes at least one grounding via, the conductive layer further includes at least one second bump pad, the grounding via is located within the second main body and has an end electrically connected to the first substrate and another end electrically connected to the second bump pad.

16. The MEMS package structure of claim 15, wherein the second main body further defines at least one second via hole extending through the second main body, and the grounding via is disposed in the second via hole.

17. The MEMS package structure of claim 16, wherein the second substrate includes a plurality of signal vias and a plurality of grounding vias, and the grounding vias surround the signal vias.

18. The MEMS package structure of claim 15, wherein a portion of the grounding via is exposed from a periphery surface of the second main body.

19. The MEMS package structure of claim 12, wherein the second substrate further includes a protection layer covering a portion of the conductive layer and the second surface of the second main body.

20. The MEMS package structure of claim 1, wherein the second substrate has an inner wall that includes the surface of the second substrate, and the second substrate further includes an inner shielding layer, the inner wall defines the cavity, and the inner shielding layer is disposed on the inner wall.

21. The MEMS package structure of claim 1, wherein the second substrate has a periphery surface and further includes an outer shielding layer, and the outer shielding layer is disposed on the periphery surface.

22. A microelectromechanical systems (MEMS) package structure, comprising:

a substrate having a first surface and a second surface opposite the first surface, and defining a recess and a through hole, wherein the recess is recessed from the first surface, and the through hole extends through the substrate and communicates with the recess;

a transducer unit disposed in the recess and electrically connected to the substrate, and including a base and a membrane, wherein the membrane is located between the through hole and the base;

a semiconductor chip electrically connected to the transducer unit through the substrate; and a lid attached to the substrate and defining a cavity, wherein the cavity is recessed from a surface of the lid, and the transducer unit and the semiconductor chip are disposed in the cavity.

23. The MEMS package structure of claim 22, wherein a width of the through hole is less than a width of the recess.

24. The MEMS package structure of claim 22, wherein the substrate includes a main body, a first patterned circuit layer and a second patterned circuit layer, the main body has a first surface and a second surface opposite the first surface of the main body, and defines the recess and the through hole, the first patterned circuit layer is disposed adjacent the first surface of the main body, the second patterned circuit layer is disposed adjacent the second surface of the main body, the first patterned circuit layer is electrically connected to the second patterned circuit layer, the transducer unit is electrically connected to the second patterned circuit layer, and the semiconductor chip is electrically connected to the first patterned circuit layer.

25. The MEMS package structure of claim 24, wherein the substrate further includes at least one first conductive via electrically connecting the first patterned circuit layer and the second patterned circuit layer, and the semiconductor chip is electrically connected to the second patterned circuit layer through the first conductive via.

26. The MEMS package structure of claim 25, wherein the main body further defines at least one first via hole extending through the main body, and the first conductive via is disposed in the first via hole.

27. The MEMS package structure of claim 26, wherein the substrate further includes at least one second conductive via electrically connecting the second patterned circuit layer and the transducer unit.

28. The MEMS package structure of claim 27, wherein the main body further defines at least one second via hole extending through the main body and communicating with the recess, and the second conductive via is disposed in the second via hole.

29. The MEMS package structure of claim 24, wherein the substrate further includes a first protection layer and a second protection layer, the first protection layer covers a portion of the first patterned circuit layer and the first surface of the main body, and the second protection layer covers a portion of the second patterned circuit layer and the second surface of the main body.

30. The MEMS package structure of claim 22, wherein the transducer unit is an MEMS microphone.

31. The MEMS package structure of claim 22, wherein the transducer unit is attached to the substrate via flip-chip bonding.

32. The MEMS package structure of claim 22, wherein the base has a first surface and a second surface opposite the first surface of the base, and defines an opening extending through the base, the membrane is disposed adjacent to the first surface of the base and covers the opening, and the first surface of the base is electrically connected to the substrate.

33. The MEMS package structure of claim 22, wherein the base defines an opening extending through the base, the membrane covers the opening, and the opening communicates with the cavity of the lid.

34. The MEMS package structure of claim 22, wherein the base defines an opening extending through the base, the membrane covers the opening, and the membrane is closer to substrate than is the opening.

35. The MEMS package structure of claim 22, wherein the semiconductor chip is attached to the substrate via flip-chip bonding.

36. The MEMS package structure of claim 22, further comprising a protective material disposed between an outer surface of the transducer unit and an inner surface of the recess.

* * * * *